（12） United States Patent
Kim et al.

(10) Patent No.: US 12,518,685 B2
(45) Date of Patent: *Jan. 6, 2026

(54) DISPLAY APPARATUS

(71) Applicant: LG Display Co., Ltd., Seoul (KR)

(72) Inventors: Tae Gung Kim, Paju-si (KR); Kyu Hwan Joo, Paju-si (KR); Jae Yeong Go, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/814,126

(22) Filed: Aug. 23, 2024

(65) Prior Publication Data

US 2024/0420628 A1   Dec. 19, 2024

Related U.S. Application Data

(63) Continuation of application No. 17/974,449, filed on Oct. 26, 2022, now Pat. No. 12,106,702.

(30) Foreign Application Priority Data

Dec. 31, 2021  (KR) .................. 10-2021- 0194674

(51) Int. Cl.
*G09G 3/3258*   (2016.01)
*G09G 3/32*     (2016.01)

(52) U.S. Cl.
CPC ......... *G09G 3/32* (2013.01); *G09G 2300/023* (2013.01); *G09G 2300/0452* (2013.01);
(Continued)

(58) Field of Classification Search
CPC ..... H01L 21/66; H01L 23/525; H01L 25/075; H01L 29/08; H01L 29/423; H01L 27/15; H01L 27/32; H01L 33/00; H01L 33/30; H01L 33/32; H01L 33/50; H01L 33/62; H01L 51/10; H01L 51/50; H01L 51/56; G09G 3/20; G09G 3/30; G09G 3/32; G09G 3/325; G09G 3/038; G09G 3/3233;
(Continued)

(56) References Cited

U.S. PATENT DOCUMENTS 7,522,172 B2   4/2009  Tanase et al.
9,129,923 B1   9/2015  Han et al.
(Continued)

FOREIGN PATENT DOCUMENTS

CN   105097867 A   11/2015
CN   111402745 A   7/2020
(Continued)

*Primary Examiner* — Chanh D Nguyen
*Assistant Examiner* — Nguyen H Truong
(74) *Attorney, Agent, or Firm* — Seed Intellectual Property Law Group LLP

(57) ABSTRACT

A display apparatus includes a first pixel including a light emitting device of a first color connected to a first data line and independently driven and a second pixel including a light emitting device of the first color connected to a second data line adjacent to the first data line and independently driven, wherein the first pixel and the second pixel are included in a first unit pixel, and the first pixel and the second pixel are alternately on-driven in a first period and a succeeding second period.

19 Claims, 19 Drawing Sheets

(52) U.S. Cl.
CPC . *G09G 2310/0275* (2013.01); *G09G 2310/08* (2013.01); *G09G 2320/0242* (2013.01); *G09G 2320/0673* (2013.01); *G09G 2330/023* (2013.01); *G09G 2330/10* (2013.01); *G09G 2360/16* (2013.01)

(58) Field of Classification Search
CPC .. G09G 3/3216; G09G 3/3291; G09G 3/3266; G09G 3/3275; G09G 3/3225; G09G 3/3258; G09G 2300/023; G09G 2300/0452; G09G 3210/08; G09G 3210/0275; G09G 2320/0242; G09G 2320/0673; G09G 2330/10; G09G 2330/023; G09G 2360/16
See application file for complete search history.

(56) References Cited

U.S. PATENT DOCUMENTS

| | | |
|---|---|---|
| 9,583,037 B2 | 2/2017 | Omoto |
| 2009/0315874 A1 | 12/2009 | Kim |
| 2015/0015468 A1 | 1/2015 | Ko et al. |
| 2016/0012779 A1 | 1/2016 | Gu et al. |
| 2017/0148389 A1* | 5/2017 | Zhou .................. G09G 3/3258 |
| 2018/0226019 A1 | 8/2018 | Tong et al. |
| 2018/0342206 A1 | 11/2018 | Zhou et al. |
| 2019/0189049 A1 | 6/2019 | An |
| 2020/0327843 A1* | 10/2020 | Ahmed .................. G09G 3/32 |

FOREIGN PATENT DOCUMENTS

| | | |
|---|---|---|
| JP | 2006330237 A | 12/2006 |
| JP | 2010020154 A | 1/2010 |
| JP | 2013120321 A | 6/2013 |
| JP | 2015102685 A | 6/2015 |
| JP | 2018010309 A | 1/2018 |
| JP | 2020522017 A | 7/2020 |
| JP | 2020531906 A | 11/2020 |
| KR | 10-2008-0102630 A | 11/2008 |
| KR | 2015-0128038 A | 11/2015 |
| WO | 2020174879 A1 | 9/2020 |
| WO | 2021085755 A1 | 5/2021 |
| WO | 2021137355 A1 | 7/2021 |

* cited by examiner

Pixel Map

00 : All Off
01 : Redundancy Pixel On
10 : Main Pixel On
11 : Main, Redundancy Pixel On

*Fig. 12*

Defect Map

00 : Idle
01 : Redundancy Pixel Defect
10 : Main Pixel Defect
11 : Neighbor Pixel Defect

*Fig. 13*

DISPLAY APPARATUS

CROSS-REFERENCE TO RELATED APPLICATIONS

This application is a continuation of U.S. patent application Ser. No. 17/974,449 filed Oct. 26, 2022, which claims the benefit of the Korean Patent Application No. 10-2021-0194674 filed on Dec. 31, 2021, which is hereby incorporated by reference as if fully set forth herein.

BACKGROUND

Technical Field

The present disclosure relates to a display apparatus, and more particularly, to a display apparatus based on micro LEDs.

Description of the Related Art

Large-sized displays may be used in various fields such as indoor and outdoor digital advertisements. In order to satisfy the demands for large-sized displays, tiling display apparatuses capable of being expanded have been proposed. In tiling display apparatuses, a single screen is configured by connecting a plurality of display modules, and a desired screen size may be implemented by adjusting the number of display modules connected to one another.

A display panel included in each display module in tiling display apparatuses may be manufactured based on a micro light emitting diode (LED) so as to realize low power consumption. Micro LEDs may denote ultra-small LEDs having a size of 100 μm or less, or may denote a case where a wafer is not provided in manufacturing LED chips. Micro LEDs are thinner and brighter than conventional organic light emitting diodes (OLEDs), but because a size is small, it is difficult to mount red (R), green (G), and blue (B) micro LED chips on a substrate through a transfer process.

Various transfer technologies for micro LED chips have been known.

BRIEF SUMMARY

The inventors have realized that, although various transfer technologies for micro LED chips have been known, but because there are many transfer errors, a yield rate of products is not high. Due to such transfer errors, a driving method for increasing a yield rate of products is needed.

To overcome the aforementioned problem of the related art, the present disclosure may provide a display apparatus based on micro LEDs, in which a yield rate of products is enhanced.

To achieve these technical benefits and other advantages and in accordance with the purpose of the disclosure, as embodied and broadly described herein, a display apparatus includes a first pixel including a light emitting device of a first color connected to a first data line and independently driven and a second pixel including a light emitting device of the first color connected to a second data line adjacent to the first data line and independently driven, wherein the first pixel and the second pixel are included in a first unit pixel, and the first pixel and the second pixel are alternately on-driven in a first period and a succeeding second period.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings:

FIGS. 11 to 15B are diagrams illustrating a configuration of a timing controller and a data driver according to an embodiment of the present disclosure.

DETAILED DESCRIPTION

Figure 1:
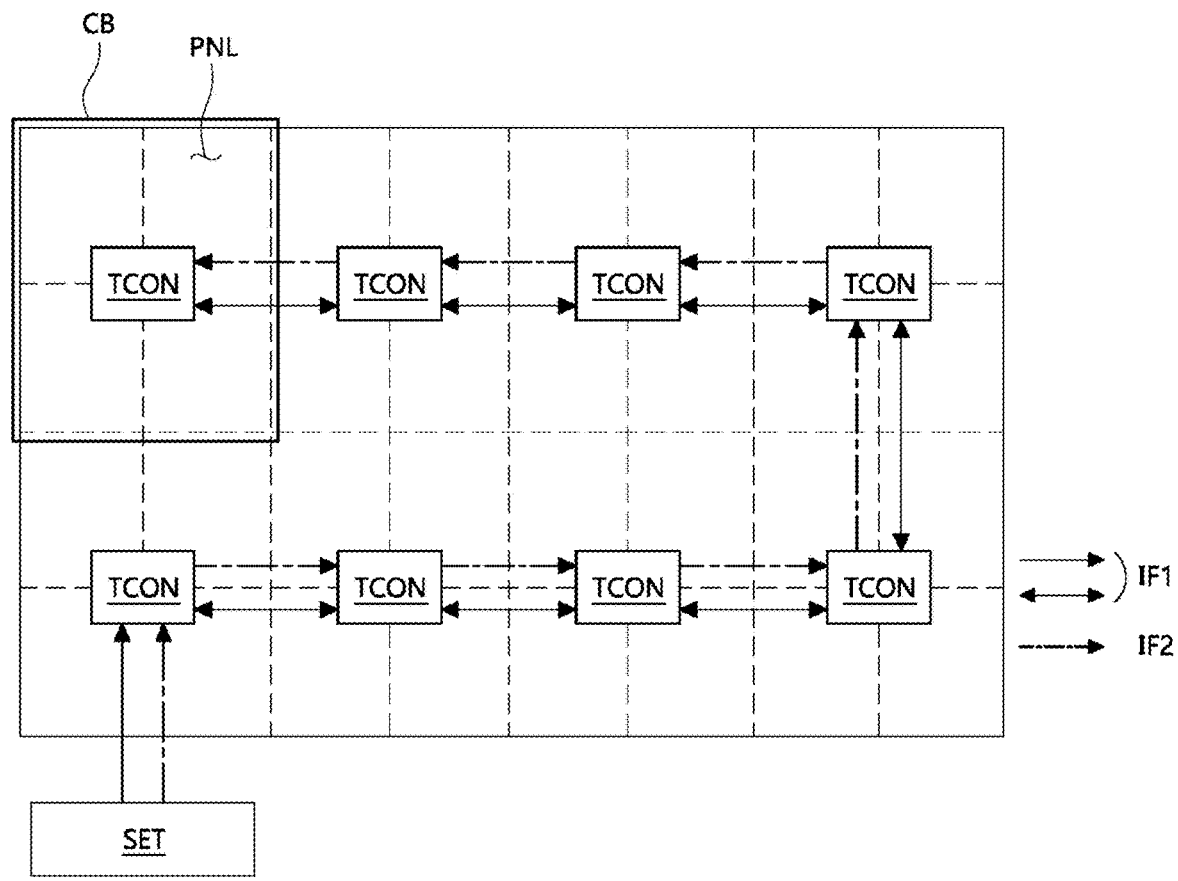
FIG. 1 is a diagram schematically illustrating a tiling display apparatus according to an embodiment of the present disclosure.

Hereinafter, the present disclosure will be described more fully with reference to the accompanying drawings, in which example embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

The shapes, sizes, ratios, angles, numbers and the like disclosed in the drawings for description of various embodiments of the present disclosure to describe embodiments of the present disclosure are merely examples and the present disclosure is not limited thereto. Like reference numerals refer to like elements throughout. Throughout this specification, the same elements are denoted by the same reference numerals. As used herein, the terms "comprise," "having," "including" and the like suggest that other parts can be added unless the term "only" is used. As used herein, the singular forms "a," "an," and "the" are intended to include the plural forms as well, unless context clearly indicates otherwise.

Elements in various embodiments of the present disclosure are to be interpreted as including margins of error even without explicit statements.

In describing a position relationship, for example, when a position relation between two parts is described as "on~," "over~," "under~," and "next~," one or more other parts may be disposed between the two parts unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In the following description, when the detailed description of the relevant known function or configuration is determined to unnecessarily obscure the important point of the present disclosure, the detailed description will be omitted. Hereinafter, embodiments of the present disclosure will be described in detail with reference to the accompanying drawings.

Figure 2:
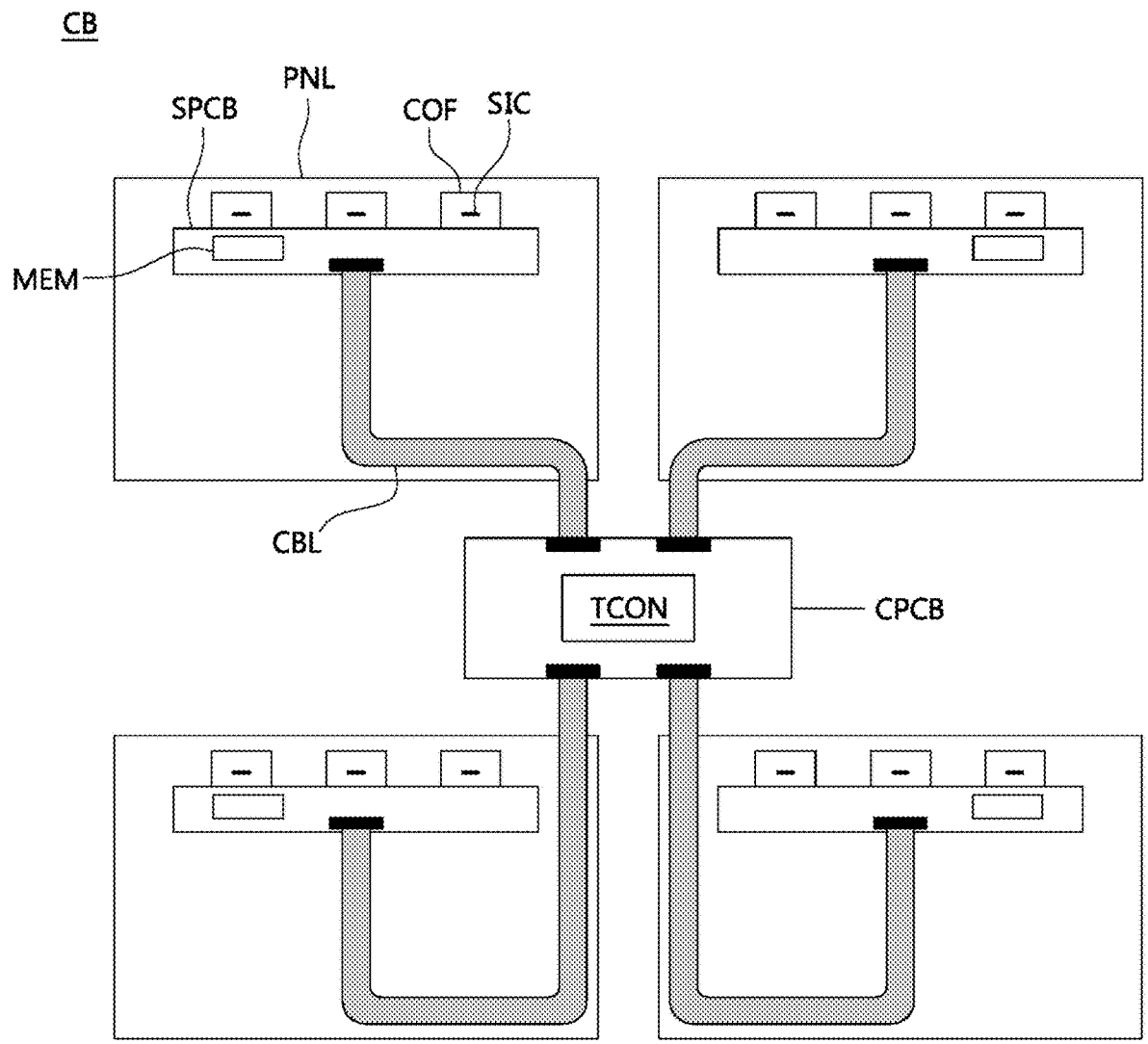
FIG. 2 is a diagram illustrating a connection configuration of a display module.

FIG. 1 is a diagram schematically illustrating a tiling display apparatus 100 according to an embodiment of the present disclosure, and FIG. 2 is a diagram illustrating a connection configuration of a display module.

Referring to FIGS. 1 and 2, the tiling display apparatus 100 according to an embodiment of the present disclosure may include a set board SET and a plurality of display modules CB. Each of the display modules CB may be referred to as a cabinet.

The plurality of display modules CB may be connected to one another through a serial interface circuit to configure a large screen. A total resolution of the large screen may be determined as a total sum of unit resolutions of each display module CB. For example, in a case where a large screen is configured by eight display modules having a unit resolution of 960*1080, a total resolution of the large screen may be 3840*2160.

The plurality of display modules CB may be connected to one another through a first interface circuit IF1 based on a bidirectional serial communication scheme, so as to execute a target operation corresponding to a control command signal input from the set board SET. A bidirectional first interface circuit IF1 may be implemented as a bidirectional multi chain interface of a feedback loop type between adjacent display modules CB. Individual bidirectional serial communication between the plurality of display modules CB may be performed by the bidirectional first interface circuit IF1, and thus, a short communication line may be secured and the speed and reliability of massive data communication based on a short communication line may be enhanced, but the present disclosure is not limited thereto. The bidirectional first interface circuit IF1 may be implemented as a dual serial peripheral interface (SPI), but the present disclosure is not limited thereto.

A first display module of the plurality of display modules CB may be connected to the set board SET through a unidirectional or bidirectional first interface circuit IF1. When the unidirectional first interface circuit IF1 is applied, connection compatibility between the first display module and the set board SET may be good. On the other hand, when the bidirectional first interface circuit IF1 is applied, a communication speed between the first display module and the set board SET may increase. The unidirectional first interface circuit IF1 may be implemented as a single SPI, but the present disclosure is not limited thereto.

The set board SET may sequentially transfer image data, which is for implementing an input image, to the plurality of display modules CB through a unidirectional or bidirectional second interface circuit IF2. The second interface circuit IF2 may be implemented based on V-by-One (Vx1) capable of high-speed and large-capacity interfacing, but is not limited thereto.

Each display module CB may include a plurality of display panels PNL, a plurality of panel driving circuits for driving the plurality of display panels PNL, and a plurality of timing controllers TCON which control operation timings of the plurality of panel driving circuits.

Each of the display panels PNL may be implemented as an electroluminescent display type based on a micro light emitting diode (LED), but is not limited thereto and may be implemented with light emitting devices including a mini LED.

The plurality of timing controllers TCON may be connected to one another through the first and second interface circuits IF1 and IF2. The timing controller TCON of each display module CB may be mounted on a control printed circuit board CPCB and may be connected to panel driving circuits of a corresponding display module CB in parallel through a branch cable CBL.

The plurality of panel driving circuit may be independently included in each of the plurality of display panels PNL configuring the same display module CB. The plurality of panel driving circuit may include a source printed circuit board SPCB connected to the timing controller TCON through the branch cable CBL, a memory circuit MEM mounted on the source printed circuit board SPCB, a conductive film COF electrically connecting the source printed circuit board SPCB to the display panel PNL, a data driver SIC bonded to the conductive film COF, and a gate driver and a power circuit electrically connected to the source printed circuit board SPCB.

The memory circuit MEM may be a non-volatile memory which stores panel characteristic information and may be flash memory and/or electrically erasable programmable read-only memory (EEPROM). The panel characteristic information may include a correction value for gamma setting, a first compensation value for compensating for a driving characteristic deviation/color deviation between pixels, a second compensation value for compensating for a boundary deviation between adjacent display panels PNL, various image qualities, and driving control data. In the panel characteristic information, a high amount of data may be stored in flash memory, and a low amount of data may be stored in EEPROM.

The timing controller TCON may operate the panel driving circuit on the basis of a control command signal received through a control interface circuit such as a serial peripheral interface (SPI) to execute a target operation corresponding to the control command signal, and thus, may generate a control response signal including an execution result of the target operation. The target operation may include reset, mute (dark change), average picture level (APL) range change, gamma change, image quality compensation value update, and firmware update. The target operation may further include an operation of writing and storing control command data in a specific memory and an operation of reading the control command data from the specific memory.

The timing controller TCON may control an operation of the panel driving circuit so as to apply image data, transferred through the first interface circuit IF1, to the display panels PNL.

Figure 3:
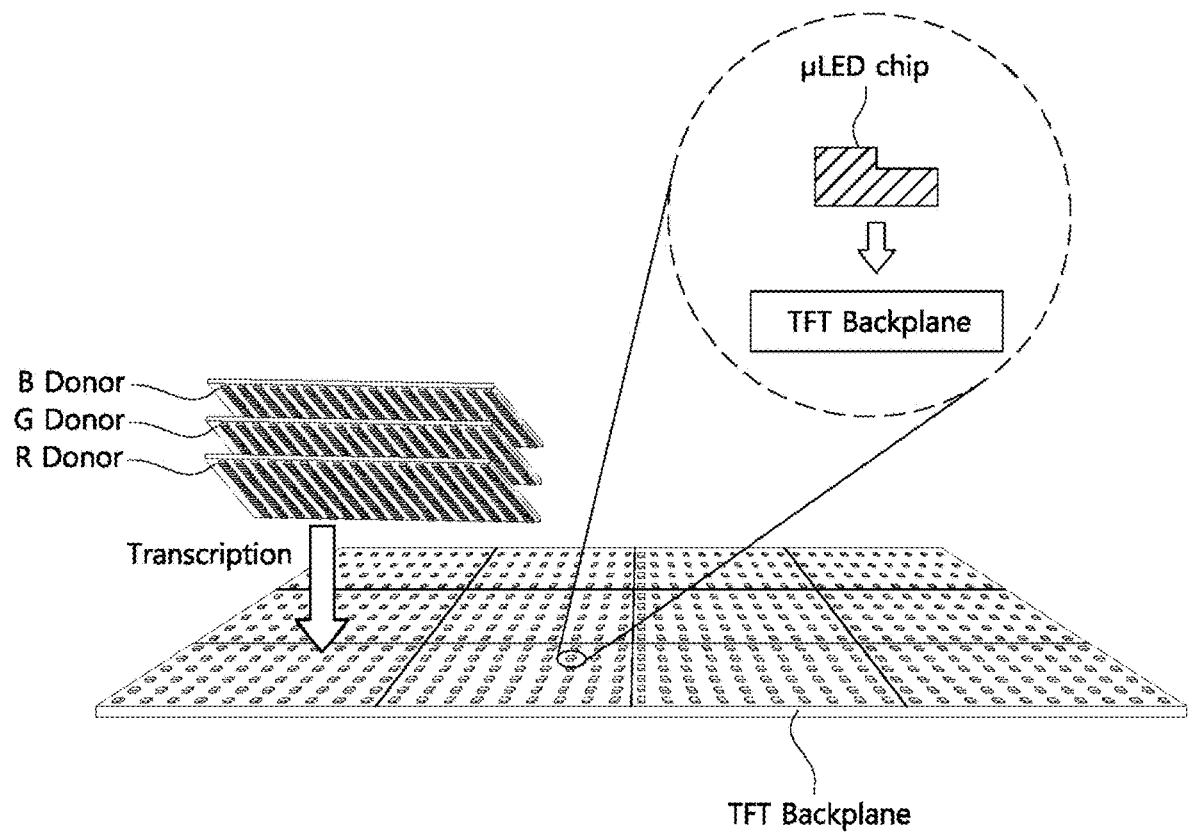
FIGS. 3 and 4 are diagrams illustrating a display panel based on a micro LED.
Figure 4:
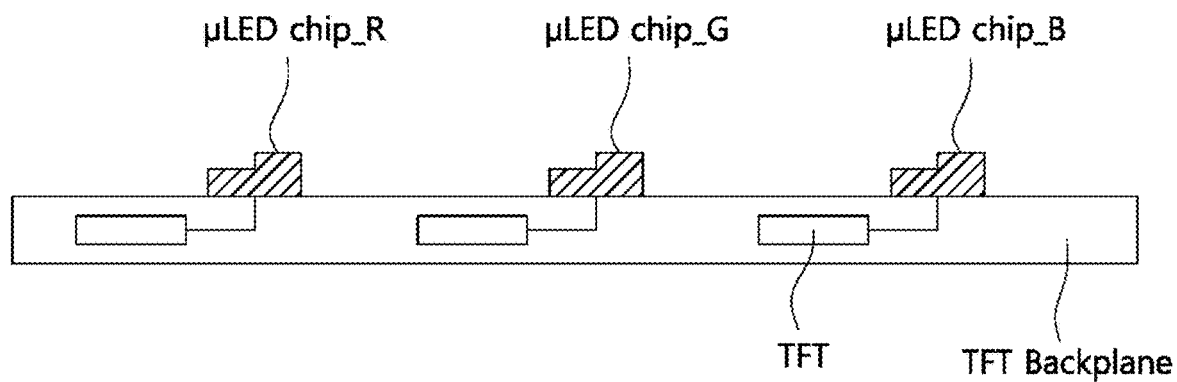
Figure 5:
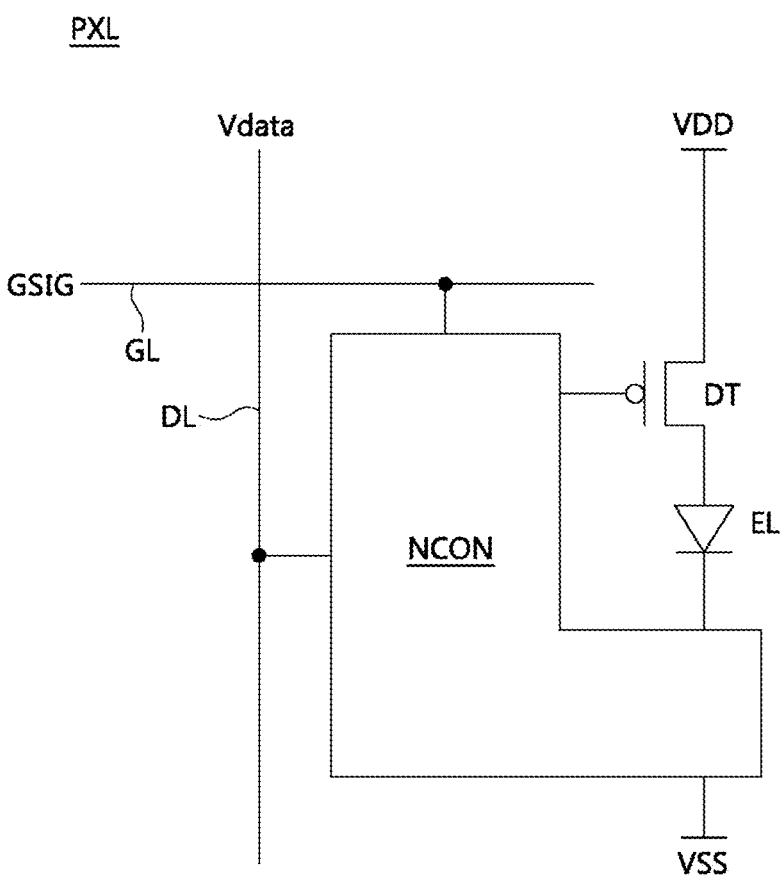
FIG. 5 is a schematic equivalent circuit diagram of a pixel included in a display panel.

FIGS. 3 and 4 are diagrams illustrating a display panel based on a micro LED. FIG. 5 is a schematic equivalent circuit diagram of a pixel included in a display panel.

Referring to FIGS. 3 and 4, a pixel array for reproducing an input image may be provided in each of the plurality of display panels PNL. A plurality of pixels may be arranged in the pixel array, and signal lines for driving the pixels may be arranged in the pixel array. The signal lines may include a plurality of data lines DL for supplying data voltages Vdata to the pixels, a plurality of gate lines GL for supplying a gate signal GSIG to the pixels, and a plurality of power lines for supplying a source voltage to the pixels.

Each of the plurality of pixels may include a micro-LED chip (μLED chip) as a light emitting device EL. A plurality of micro-LED chips (μLED chip) may include red chips (μLED chip_R), green chips (μLED chip_G), and blue chips (μLED chip_B), which are disposed on a thin film transistor (TFT) backplane. A red (R) pixel may include a red chip (μLED chip_R) as a light emitting device EL, a green (G) pixel may include a green chip (μLED chip_G) as a light emitting device EL, and a blue (B) pixel may include a blue chip (μLED chip_B) as a light emitting device EL.

The plurality of micro-LED chips (μLED chip) may be transferred from R/G/B donors, and thus, may be mounted on a TFT backplane. The red chips (μLED chip_R) may be transferred from an R donor, the green chips (μLED chip_G) may be transferred from a G donor, and the blue chips (μLED chip_B) may be transferred from a B donor. Transfer technology may use an electrostatic force, a laser, a speed-dependent tacky force, and a load-dependent tacky force. The transfer technology is not limited thereto and may use self-assembly based on an electrostatic force.

The TFT backplane may be implemented in an active matrix structure for efficient driving. In the TFT backplane, the pixels may be disposed at regions of overlap of the data lines DL, the gate lines GL, and the power lines.

A plurality of pixels may be included in one unit pixel. For example, R, G, and B pixels arranged adjacent thereto may form one unit pixel in an extension direction of the gate line GL or an extension direction of the data line DL.

As in FIG. 5, a pixel PXL may include a light emitting device EL, a driving TFT DT, and a node circuit NCON.

The node circuit NCON may be connected to the gate line GL and the data line DL. The node circuit NCON may be supplied with the data voltage Vdata through the data line DL and may be supplied with the gate signal GSIG through the gate line GL. The node circuit NCON may apply the data voltage Vdata to a gate electrode of the driving TFT DT in synchronization with the gate signal GSIG, and thus, may set a gate-source voltage of the driving TFT DT on the basis of a condition for generating a driving current. The node circuit NCON may include an internal compensation circuit which senses and compensates for a threshold voltage and/or electron mobility of the driving TFT DT.

The driving TFT DT may be a driving element which generates the driving current on the basis of the gate-source voltage thereof. The gate electrode of the driving TFT DT may be connected to the node circuit NCON, a first electrode (a drain electrode) thereof may be connected to a high level pixel power VDD, and a second electrode (a source electrode) thereof may be connected to a light emitting device EL.

The light emitting device EL may be a light emitting device which emits light having strength corresponding to the driving current input to the driving TFT DT. The light emitting device EL may be implemented with a micro-LED including an inorganic light emitting layer. A first electrode of the light emitting device EL may be connected to the driving TFT DT, and a second electrode thereof may be connected to a low level pixel power VSS.

A connection configuration and an operation of one pixel PXL may be merely an embodiment, and the spirit of the present disclosure is not limited thereto. For example, each of the driving TFT DT and the node circuit NCON may be implemented based on a PMOS transistor, or may be implemented based on an NMOS transistor. Also, the gate line GL connected to the node circuit NCON may be provided in plurality.

Figure 6:
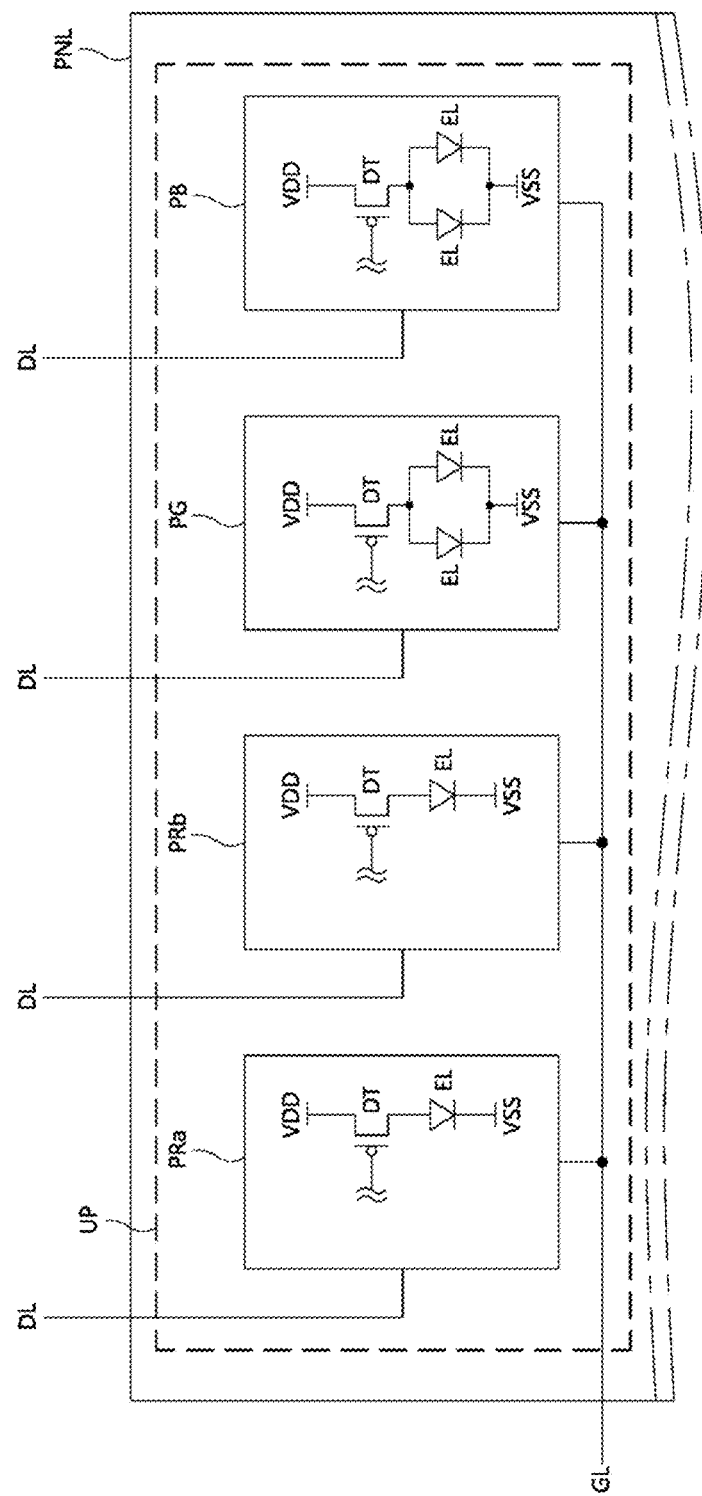
FIG. 6 is a diagram illustrating a configuration example of one unit pixel.

FIG. 6 is a diagram illustrating a configuration example of one unit pixel.

Referring to FIG. 6, in order to decrease a reduction in a yield rate caused by a transfer error of a light emitting device EL, four pixels PRa, PRb, PG, and PB of one unit pixel UP in a display panel PNL may include six light emitting devices EL.

The four pixels PRa, PRb, PG, and PB of the one unit pixel UP may be connected to different data lines DL and may be connected to the same gate line GL. The six light emitting devices EL included in the four pixels PRa, PRb, PG, and PB may include two R chips, two G chips, and two B chips.

In the G chip and the B chip, because emission efficiency is good in low current density, each two chips may be driven in parallel so as to enhance a yield rate. On the other hand, in the R chip, because emission efficiency is not good in low current density, each one chip may be independently driven (or separately driven) for a high current density.

Two R chips may include a main R chip and a redundancy R chip. The main R chip may be a light emitting device EL of an R1 pixel PRa, and the redundancy R chip may be a light emitting device EL of an R2 pixel PRb. The R1 pixel PRa may be a main pixel for displaying red, and the R2 pixel PRb may be a redundancy pixel for displaying red. Even when only one of the R1 pixel PRa and the R2 pixel PRb is driven, red may be displayed in the one unit pixel UP, and thus, a yield rate may be enhanced.

Two G chips may include a main G chip and a redundancy G chip and may be a light emitting device EL of a G pixel PG. In the G pixel PG, two G chips may be connected to each other in parallel between a driving TFT DT and a low level pixel power VSS. Even when only one of the two G chips connected to each other in parallel is driven, the G pixel PG may normally operate, and thus, a yield rate may be enhanced.

Two B chips may include a main B chip and a redundancy B chip and may be a light emitting device EL of a B pixel PB. In the B pixel PB, two B chips may be connected to each other in parallel between the driving TFT DT and the low level pixel power VSS. Even when only one of the two B chips connected to each other in parallel is driven, the B pixel PB may normally operate, and thus, a yield rate may be enhanced.

Figure 7A:
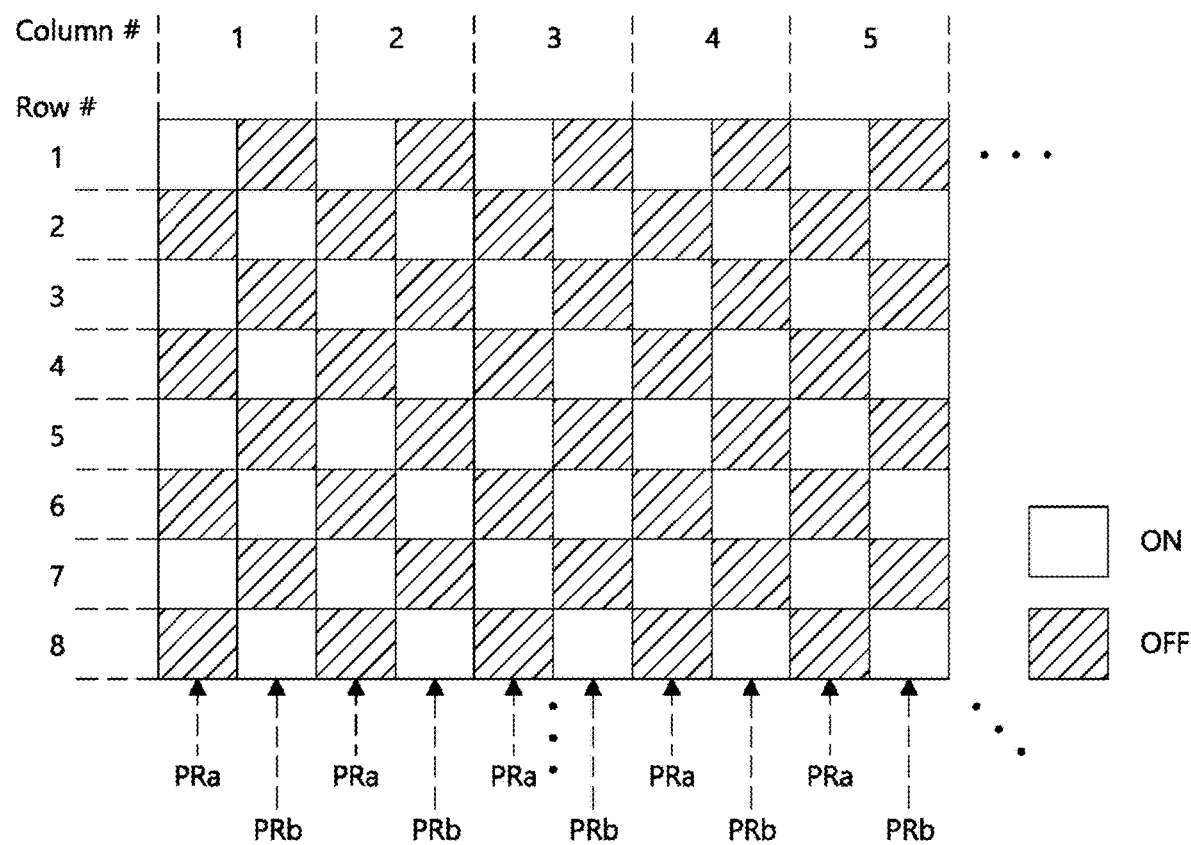
FIGS. 7A, 7B, and 8 are diagrams illustrating an alternate driving example where a main pixel and a redundancy pixel, which are included in one unit pixel and have the same color, are alternately driven.
Figure 7B:
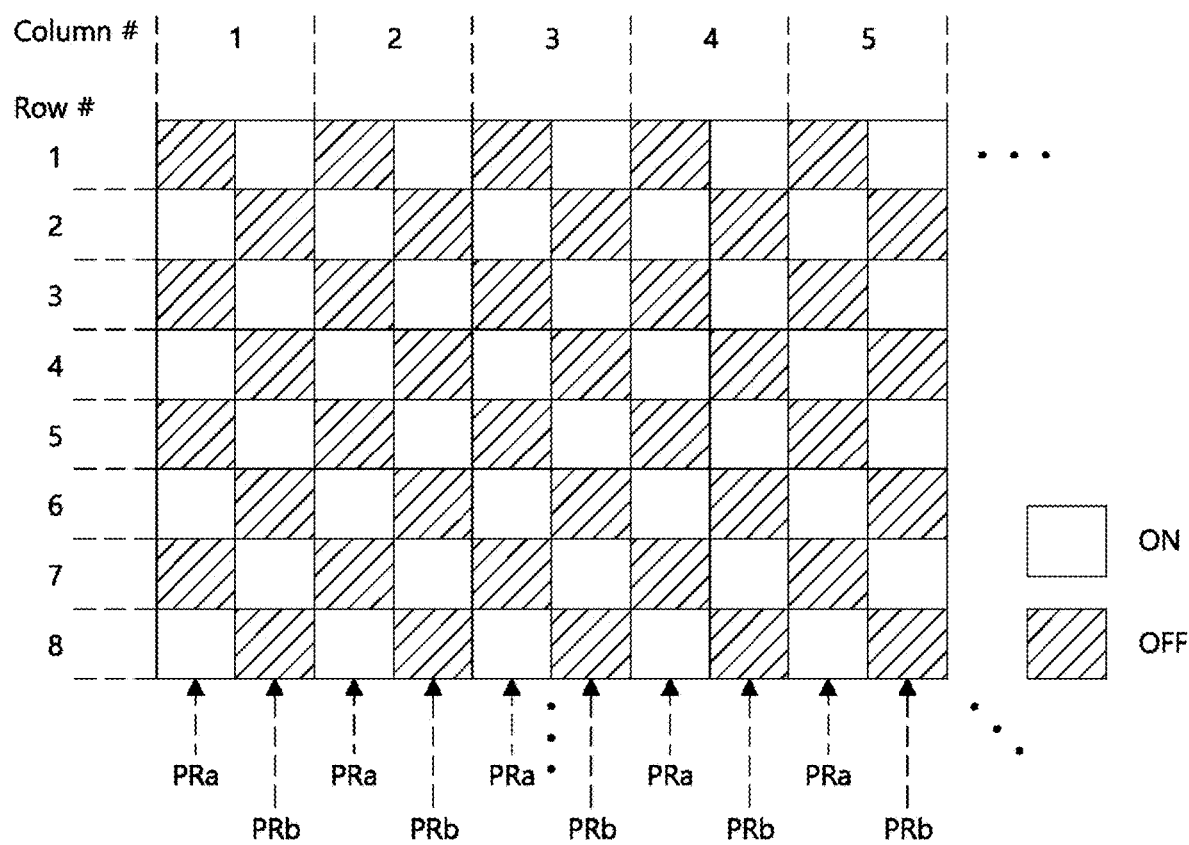
Figure 8:
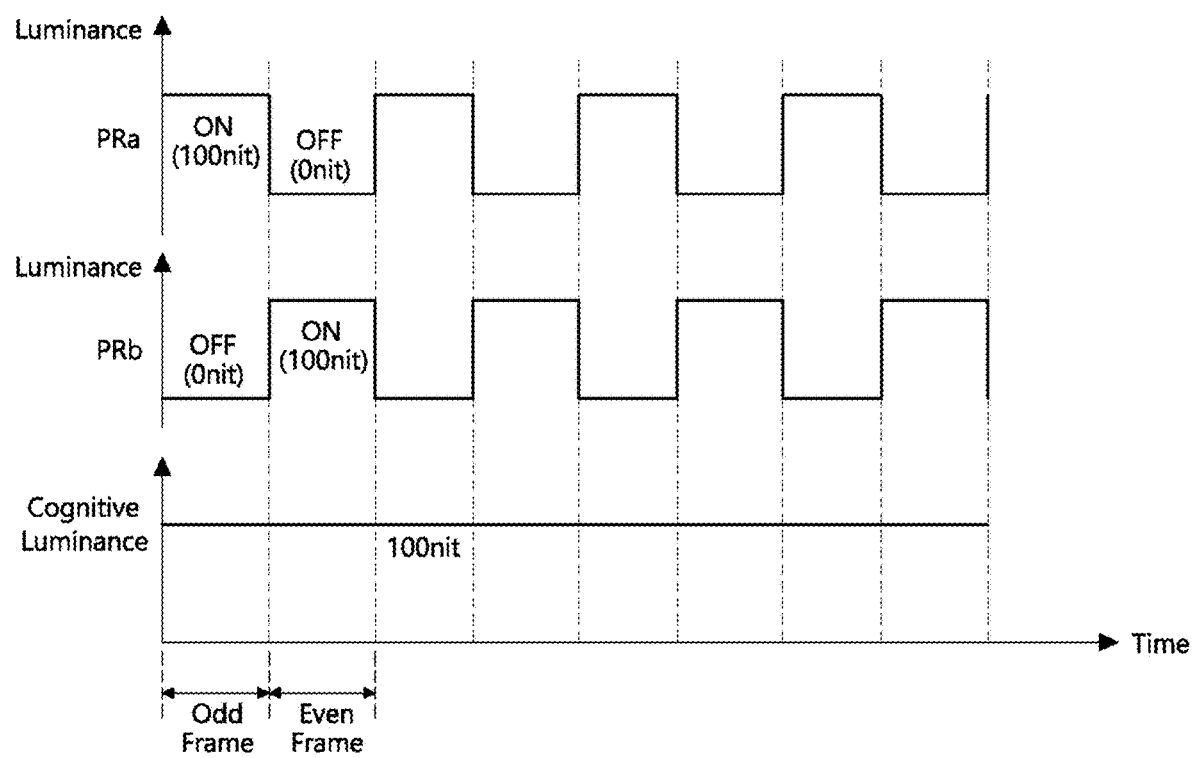

FIGS. 7A, 7B, and 8 are diagrams illustrating an alternate driving example where a main pixel and a redundancy pixel, which are included in one unit pixel and have the same color, are alternately driven. In FIGS. 7A, 7B, and 8, R pixels PRa and PRb will be described for example.

In one unit pixel UP, a G pixel PG and a B pixel PB may be on-driven continuously, and two R pixels PRa and PRb may be selectively on-driven for a high current density.

The R pixels PRa and PRb may include a main pixel PRa and a redundancy pixel PRb. A selective on driving method may include a first method which drives a pixel having relatively better emission efficiency among the main pixel PRa and the redundancy pixel PRb and a second method which alternately drives the main pixel PRa and the redundancy pixel PRb.

In the first method, because a precise luminance measurement process for selecting a pixel having better emission efficiency is needed, a tack time may increase, and because all unit pixels should be target pixels, a capacity of selection map data may be large and a resource associated with the transfer and processing of the selection map data may increase. Due to this, it may be difficult to consider the first method.

In the present embodiment, in order to solve a problem of the first method, alternate driving which is the second method may be proposed. For the alternate driving, the main pixel PRa and the redundancy pixel PRb may be alternately on-driven at a period of a certain time, for example, in a first period and a succeeding second period.

The main pixel PRa and the redundancy pixel PRb may be alternately on-driven at a period of a certain time, and on the contrary, may be alternately driven by pixel row units, whereby a check pattern (or a lattice pattern) may be formed in a display screen.

For example, in an odd frame (i.e., the first period), as in FIG. 7A, main pixels PRa disposed in odd-numbered row lines and redundancy pixels PRb disposed in even-numbered row lines may be on-driven, and redundancy pixels PRb disposed in odd-numbered row lines and main pixels PRa disposed in even-numbered row lines may be off-driven.

On the other hand, in an even frame (i.e., the second period), as in FIG. 7B, main pixels PRa disposed in odd-numbered row lines and redundancy pixels PRb disposed in even-numbered row lines may be off-driven, and redundancy pixels PRb disposed in odd-numbered row lines and main pixels PRa disposed in even-numbered row lines may be on-driven.

In alternate driving, cognitive luminance may be a sum of luminance of the main pixel PRa and luminance of the redundancy pixel PRb, which are complementarily turned on or off. A screen flicker caused by alternate driving may not be recognized in a certain refresh rate (or a frame frequency) or more.

Figure 9A:
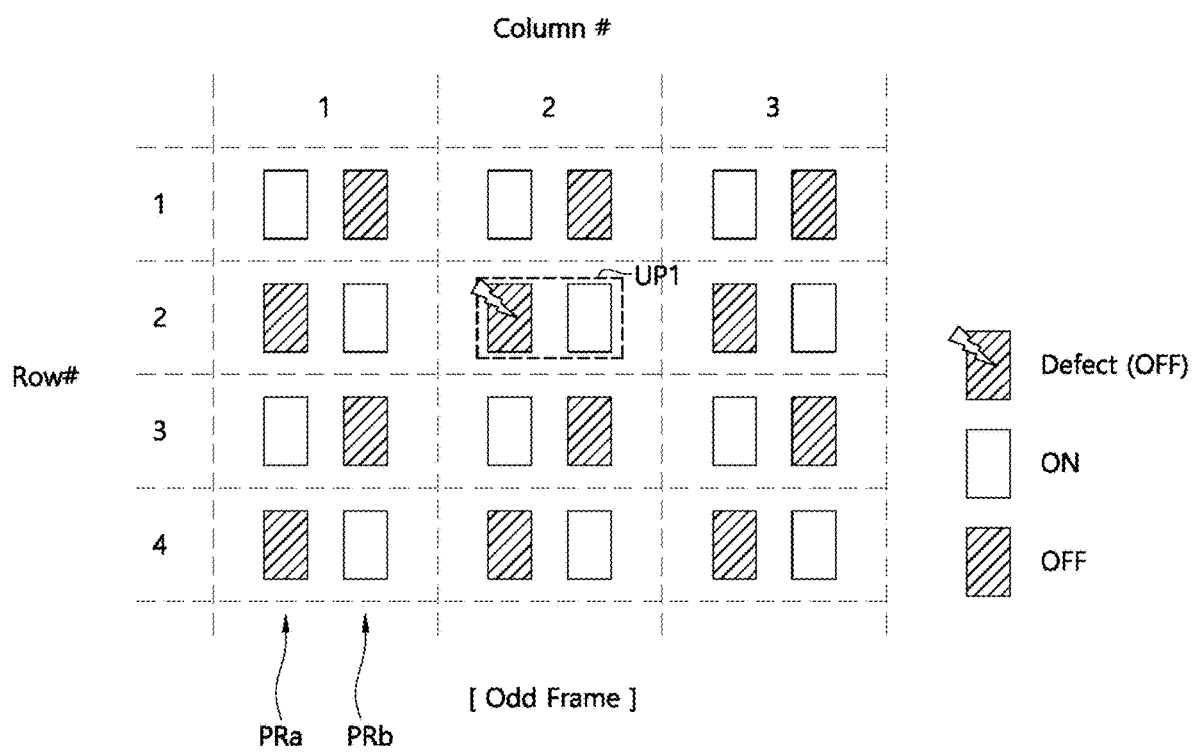
FIGS. 9A and 9B are diagrams illustrating alternate driving and alternative on driving in a case where a main pixel is a defective pixel and a redundancy pixel is a normal pixel in one unit pixel at a specific position.
Figure 9B:
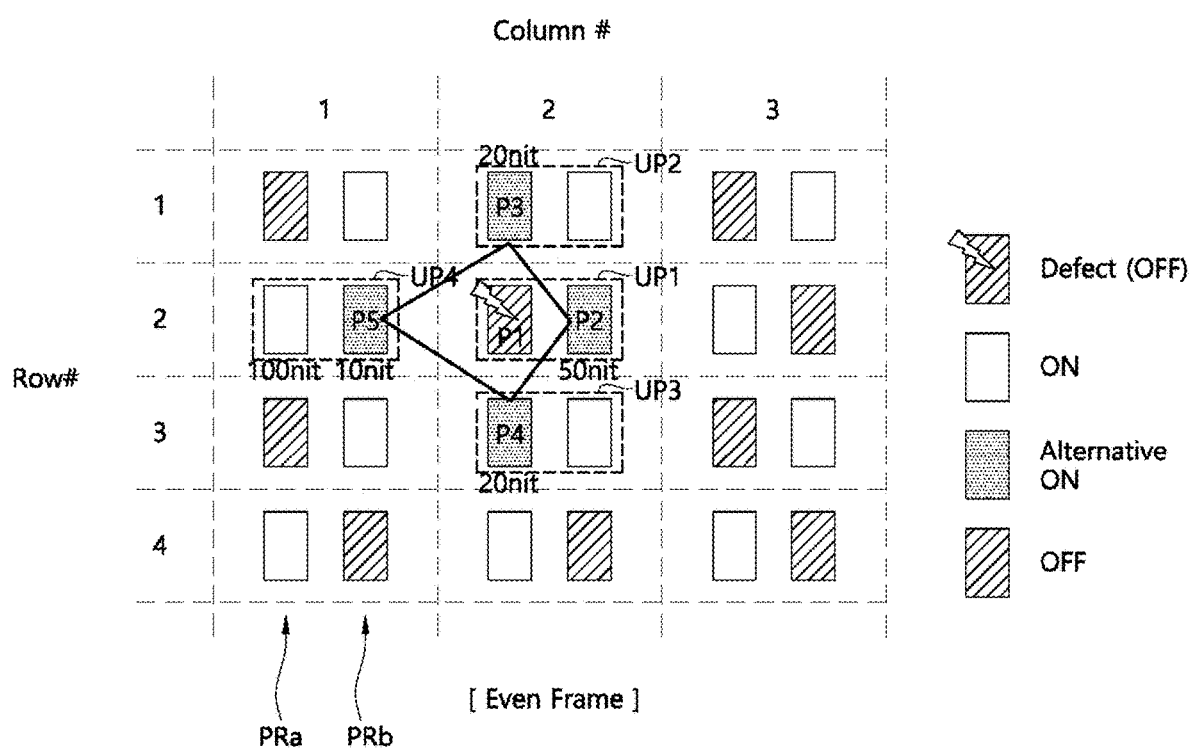

FIGS. 9A and 9B are diagrams illustrating alternate driving and alternative on driving in a case where a main pixel is a defective pixel and a redundancy pixel is a normal pixel in one unit pixel at a specific position.

A defective pixel may denote a pixel which is blackened (always off-driven) because it is difficult or impossible to implement normal luminance. A position of the defective pixel may be previously detected through a luminance measurement process and may be stored as a defect map. Comparing with a normal pixel, the defective pixel may be easily classified as a dark spot. Therefore, the luminance measurement process of detecting a position of the defective pixel may be better in tack time than the above-described luminance measurement process of selecting a pixel. Because there are few defective pixels in one screen, a capacity of a defect map related to a position of a defective pixel may be small. Accordingly, comparing with the above-described selection map data, a resource associated with the transfer and processing of the defect map data may not be large.

Because the defective pixel is always off-driven, a specific color (for example, red) in one unit pixel may be blackened at every certain time based on alternate driving.

FIG. 9A illustrates a case where main pixels PRa disposed in odd-numbered row lines and redundancy pixels PRb disposed in even-numbered row lines are on-driven and redundancy pixels PRb disposed in odd-numbered row lines and main pixels PRa disposed in even-numbered row lines are off-driven as in FIG. 7A. Also, FIG. 9B illustrates a case where main pixels PRa disposed in odd-numbered row lines and redundancy pixels PRb disposed in even-numbered row lines are off-driven and redundancy pixels PRb disposed in odd-numbered row lines and main pixels PRa disposed in even-numbered row lines are on-driven as in FIG. 7B.

For example, when the main pixel PRa is a defective pixel and the redundancy pixel PRb is a normal pixel in a first unit pixel UP1 at a specific position (Column #2, Row #2), because the redundancy pixel PRb is on-driven in an odd frame of FIG. 9A, an R pixel in the first unit pixel UP1 may not be blackened and may display red during an odd frame. Also, the main pixel PRa in the first unit pixel UP1 may be off-driven, and thus, there may be no problem.

However, FIG. 9B illustrates a case where the main pixel PRa in the first unit pixel UP1 should be on-driven and the redundancy pixel PRb should be off-driven in an even frame, and because the main pixel PRa of the first unit pixel UP1 is a defective pixel and the redundancy pixel PRb is a normal pixel, the R pixels (PRa and PRb) of the first unit pixel UP1 may be blackened during an even frame.

In order to prevent the occurrence of a dark spot, in the present embodiment, R pixels adjacent to the main pixel PRa (i.e., a defective pixel) of the first unit pixel UP1 may be alternatively on-driven in an even frame, and thus, may compensate for luminance loss caused by the turn-off of the main pixel PRa. The adjacent R pixels which are alternatively on-driven may be pixels which should be fundamentally off-driven in an even frame, and thus, even when the R pixels are alternatively on-driven, luminance distortion may not occur.

For convenience of description, it is illustrated that the main pixel PRa having a defect in the first unit pixel UP1 of FIG. 9B is a first pixel P1 and the redundancy pixel PRb which is alternatively on-driven is a second pixel P2. Also, adjacent R pixels which are alternatively on-driven are illustrated as third to fifth pixels P3 to P5. The third pixel P3 may be a main pixel PRa of a second unit pixel UP2 which is disposed to be upward adjacent to the first unit pixel UP1 in a column direction. The fourth pixel P4 may be a main pixel PRa of a third unit pixel UP3 which is disposed to be downward adjacent to the first unit pixel UP1 in the column direction. The fifth pixel P5 may be a redundancy pixel PRb of a fourth unit pixel UP4 which is disposed to be leftward adjacent to the first unit pixel UP1 in a row direction. Furthermore, in FIG. 9B, only R pixels (PRa and PRb) in each unit pixel are illustrated, and G and B pixels are omitted. The omitted G and B pixels may be disposed for each column and may configure one unit pixel along with R pixels (PRa and PRb). The G and B pixels may be sixth and seventh pixels in claims.

Referring to FIG. 9B, during an even frame, a first pixel P1 which is a defective pixel may be off-driven, and a second pixel P2, a third pixel P3, a fourth pixel P4, and a fifth pixel P5 may be alternatively on-driven. For example, when the first pixel P1 is a normal pixel having no defect, the second pixel P2, the third pixel P3, the fourth pixel P4, and the fifth pixel P5 may be pixels which should be off-driven in the even frame.

The first pixel P1 and the second pixel P2 may be pixels which are connected to the same gate line and are individually connected to adjacent data lines and independently driven. The first pixel P1 may be connected to a first data line, and the second pixel P2 may be connected to a second data line. The third pixel P3 and the fourth pixel P4 may be connected to the first data line and may each be disposed to be adjacent to the first pixel P1 in a column direction. The fifth pixel P5 may share a gate line with the first pixel P1 and may be disposed to be adjacent to the first pixel P1 with G and B pixels (i.e., sixth and seventh pixels) therebetween. Positions of R, G, and B pixels are not limited thereto.

Moreover, during an even frame, luminance distribution rates distributed to pixels P2, P3, P4, and P5 which are alternatively on-driven may be differently set based on a distance to the first pixel P1. The distance to the first pixel P1 may be closest to the second pixel P2, may be second close to the third pixel P3 and the fourth pixel P4, and may be farthest away from the fifth pixel P5. Therefore, a luminance distribution rate may be largest in the second pixel P2, may be second large in the third pixel P3 and the fourth pixel P4, and may be smallest in the fifth pixel P5. For example, when luminance which should be implemented in the first pixel P1 is 100 nit, the second pixel P2 may implement luminance of 50 nit, each of the third pixel P3 and the fourth pixel P4 may implement luminance of 20 nit, and the fifth pixel P5 may implement luminance of 10 nit, on the basis of alternative on driving.

Under an alternative driving condition, temporal/spatial positions and luminance distribution rates of the pixels P2, P3, P4, and P5 which are alternatively on-driven may be changed based on a position of a defective pixel in a display panel. To this end, a pixel map for alternate driving should be previously set, and a defect map for alternate on driving should be previously set. Also, a modulation process performed on image data based on a pixel map and a defect map should be performed. A modulation operation performed on image data for a luminance distribution rate may be performed in a timing controller or a data driver.

Because the pixels P2, P3, P4, and P5 which are alternatively on-driven are pixels which should be fundamentally off-driven in an even frame, only a compensation gray level for luminance distribution may be displayed during the even frame. Accordingly, a problem where an original image is distorted may not occur based on alternative on driving in the even frame.

Figure 10A:
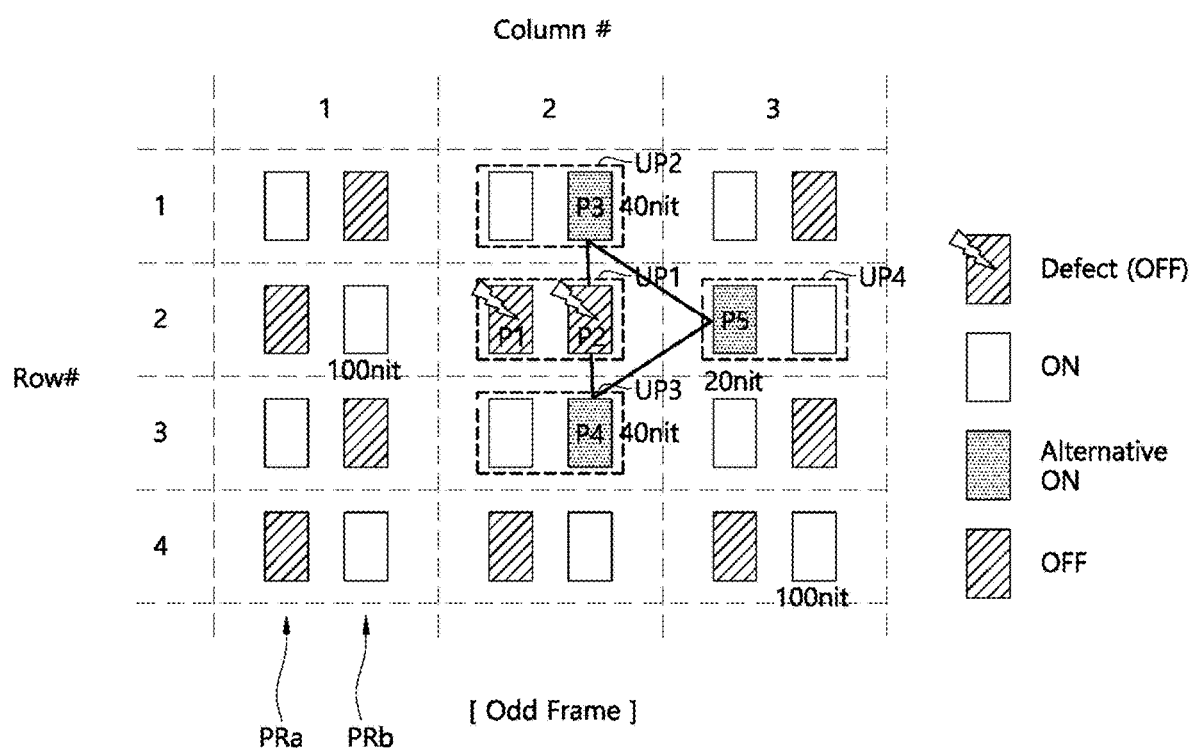
FIGS. 10A and 10B are diagrams illustrating alternate driving and alternative on driving in a case where all of a main pixel and a redundancy pixel are defective pixels in one unit pixel at a specific position.
Figure 10B:
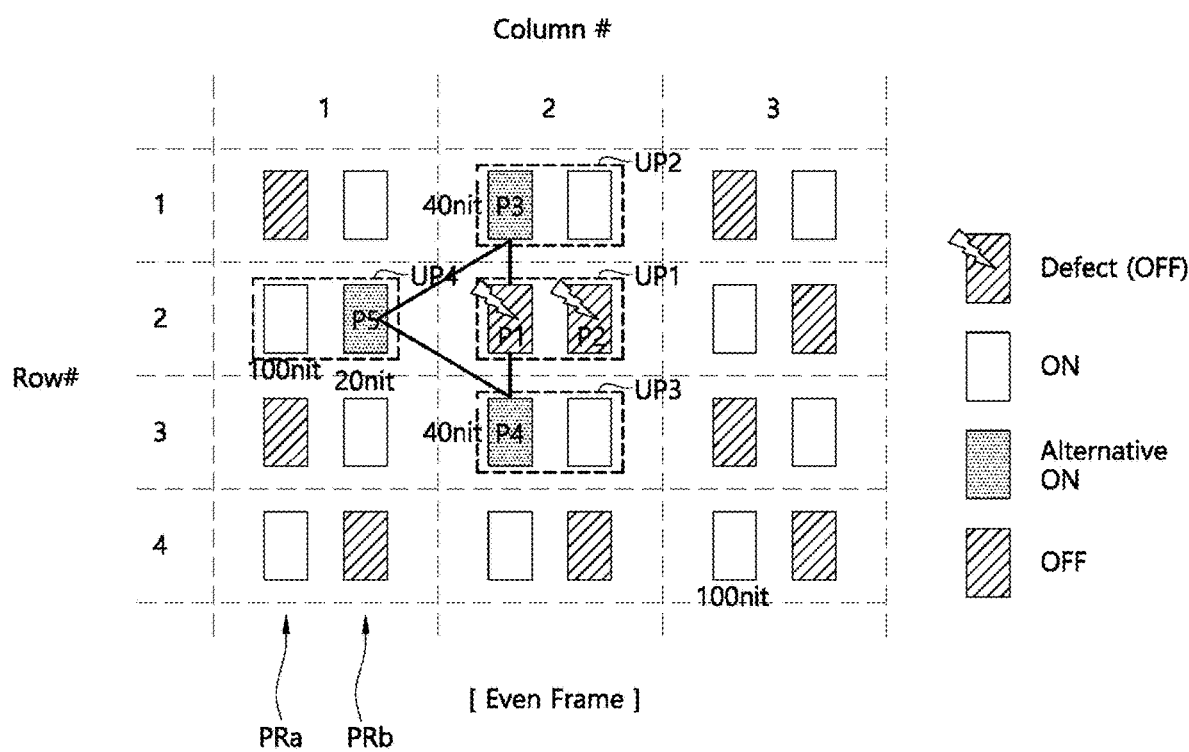
Figure 11:
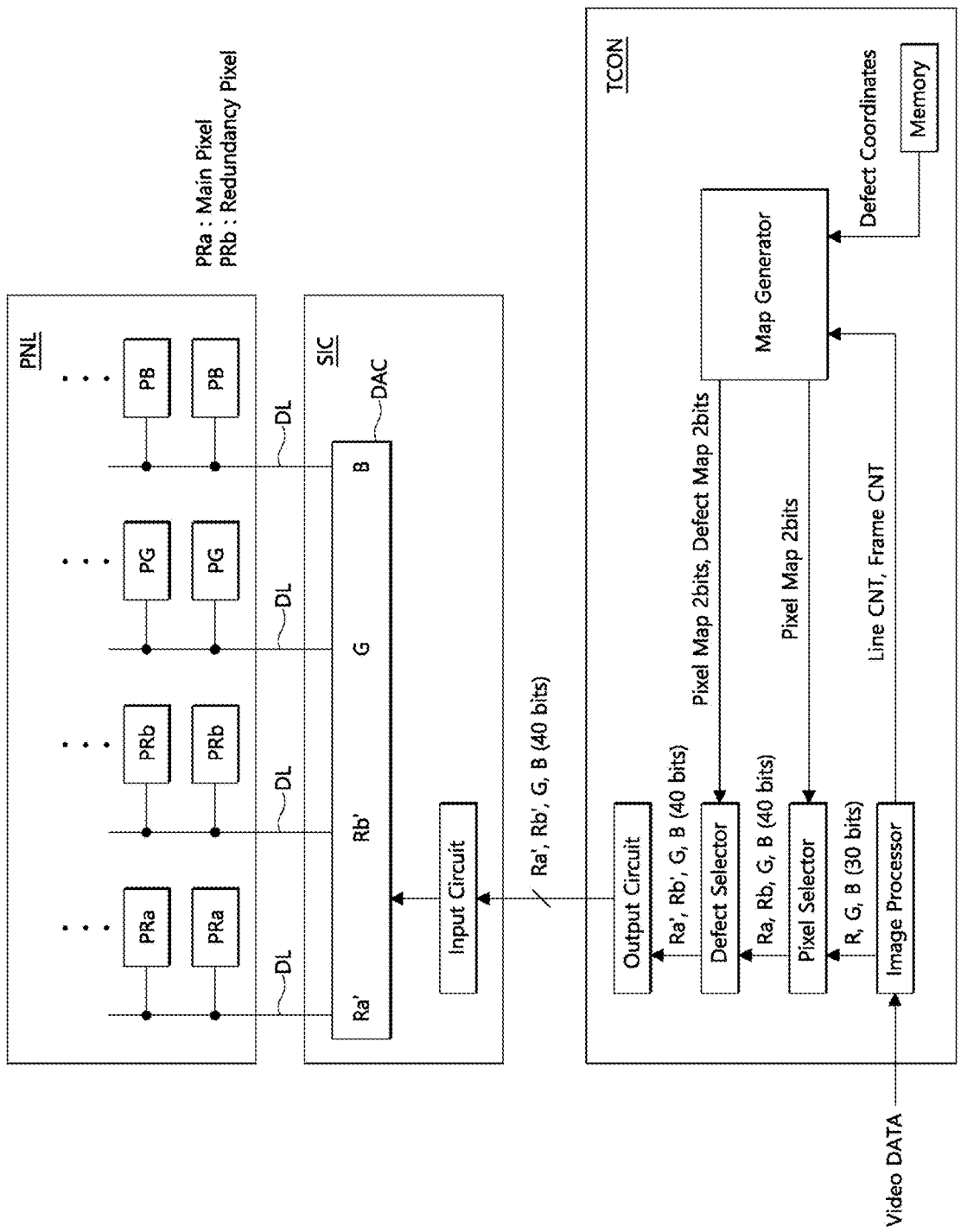

FIGS. 10A and 10B are diagrams illustrating alternate driving and alternative on driving in a case where all of a main pixel and a redundancy pixel are defective pixels in one unit pixel at a specific position. FIG. 10A illustrates a case where main pixels PRa disposed in odd-numbered row lines and redundancy pixels PRb disposed in even-numbered row lines are on-driven and redundancy pixels PRb disposed in odd-numbered row lines and main pixels PRa disposed in even-numbered row lines are off-driven as in FIG. 7A. Also, FIG. 10B illustrates a case where main pixels PRa disposed in odd-numbered row lines and redundancy pixels PRb disposed in even-numbered row lines are off-driven and redundancy pixels PRb disposed in odd-numbered row lines and main pixels PRa disposed in even-numbered row lines are on-driven as in FIG. 7B.

Because a defective pixel is always off-driven, when all of a main pixel and a redundancy pixel are defective pixels, a specific color (for example, red) in one unit pixel may be blackened.

For example, when all of a main pixel PRa and a redundancy pixel PRb are defective pixels in a first unit pixel UP1 at a specific position (Column #2,Row #2), R pixels (PRa and PRb) may be continuously blackened in the odd frame of FIG. 10A and the even frame of FIG. 10B.

In order to prevent the occurrence of a dark spot, in the present embodiment, some R pixels of second to fourth unit pixels UP adjacent to a redundancy pixel PRb (i.e., a defective pixel) which should be on-driven in an odd frame may be alternatively on-driven, and thus, may compensate for luminance loss caused by the turn-off of the redundancy pixel PRb. The R pixels which are alternatively on-driven may be pixels which should be fundamentally off-driven in an odd frame, and thus, even when the R pixels are alternatively on-driven, luminance distortion may not occur.

For convenience of description, the main pixel PRa and the redundancy pixel PRb having a defect in the first unit pixel UP1 of FIG. 10A are respectively illustrated as a first pixel P1 and a second pixel P2. Also, adjacent R pixels which are alternatively on-driven are illustrated as third to fifth pixels P3 to P5. The third pixel P3 may be a redundancy pixel PRb of a second unit pixel UP2 which is disposed to be upward adjacent to the first unit pixel UP1 in a column direction. The fourth pixel P4 may be a redundancy pixel PRb of a third unit pixel UP3 which is disposed to be downward adjacent to the first unit pixel UP1 in the column direction. The fifth pixel P5 may be a main pixel PRa of a fourth unit pixel UP4 which is disposed to be rightward adjacent to the first unit pixel UP1 in a row direction. Furthermore, in FIG. 10A, only R pixels (PRa and PRb) in each unit pixel are illustrated, and G and B pixels are omitted. The omitted G and B pixels may be disposed for each column and may configure one unit pixel along with R pixels (PRa and PRb). The G and B pixels may be sixth and seventh pixels in claims.

Referring to FIG. 10A, during an odd frame, a first pixel P1 and a second pixel P2 which are defective pixels may be off-driven, and a third pixel P3, a fourth pixel P4, and a fifth pixel P5 may be alternatively on-driven. For example, when the second pixel P2 is a normal pixel having no defect, the third pixel P3, the fourth pixel P4, and the fifth pixel P5 may be pixels which should be off-driven in the odd frame.

The first pixel P1 and the second pixel P2 may be pixels which are connected to the same gate line and are individually connected to adjacent data lines and independently driven. The first pixel P1 may be connected to a first data line, and the second pixel P2 may be connected to a second data line. The third pixel P3 and the fourth pixel P4 may be connected to the second data line and may each be disposed to be adjacent to the second pixel P2 in a column direction. The fifth pixel P5 may share a gate line with the second pixel P2 and may be disposed to be adjacent to the second pixel P2 with G and B pixels (i.e., sixth and seventh pixels) therebetween. Positions of R, G, and B pixels are not limited thereto.

During an odd frame, luminance distribution rates distributed to pixels P3, P4, and P5 which are alternatively on-driven may be differently set based on a distance to the second pixel P2. The distance to the second pixel P2 may be relatively closer to the third pixel P3 and the fourth pixel P4 and may be relatively farther away from the fifth pixel P5. Therefore, a luminance distribution rate may be relatively larger in the third pixel P3 and the fourth pixel P4 and may be relatively smaller in the fifth pixel P5. For example, when luminance which should be implemented in the second pixel P2 is 100 nit, each of the third pixel P3 and the fourth pixel P4 may implement luminance of 40 nit, and the fifth pixel P5 may implement luminance of 20 nit, on the basis of alternative on driving.

Referring to FIG. 10B, in the present embodiment, R pixels adjacent to a main pixel PRa (i.e., a defective pixel) may be alternatively on-driven in an even frame, and thus, may compensate for luminance loss caused by the turn-off of the main pixel PRa. The R pixels which are alternatively on-driven may be pixels which should be fundamentally off-driven in an even frame, and thus, even when the R pixels are alternatively on-driven, luminance distortion may not occur.

For convenience of description, the main pixel PRa and the redundancy pixel PRb having a defect in the first unit pixel UP1 of FIG. 10B are respectively illustrated as a first pixel P1 and a second pixel P2. Also, adjacent R pixels which are alternatively on-driven are illustrated as third to fifth pixels P3 to P5. The third pixel P3 may be a main pixel PRa of a second unit pixel UP2 which is disposed to be upward adjacent to the first unit pixel UP1 in a column direction. The fourth pixel P4 may be a main pixel PRa of a third unit pixel UP3 which is disposed to be downward adjacent to the first unit pixel UP1 in the column direction. The fifth pixel P5 may be a redundancy pixel PRb of a fourth unit pixel UP4 which is disposed to be leftward adjacent to the first unit pixel UP1 in a row direction. Furthermore, in FIG. 10B, only R pixels (PRa and PRb) in each unit pixel are illustrated, and G and B pixels are omitted. The omitted G and B pixels may be disposed for each column and may configure one unit pixel along with R pixels (PRa and PRb). The G and B pixels may be sixth and seventh pixels in claims.

Referring to FIG. 10B, during an even frame, a first pixel P1 and a second pixel P2 which are defective pixels may be off-driven, and a third pixel P3, a fourth pixel P4, and a fifth pixel P5 may be alternatively on-driven. For example, when the first pixel P1 is a normal pixel having no defect, the third pixel P3, the fourth pixel P4, and the fifth pixel P5 may be pixels which should be off-driven in the even frame.

The first pixel P1 and the second pixel P2 may be pixels which are connected to the same gate line and are individually connected to adjacent data lines and independently driven. The first pixel P1 may be connected to a first data line, and the second pixel P2 may be connected to a second data line. The third pixel P3 and the fourth pixel P4 may be connected to the first data line and may each be disposed to be adjacent to the first pixel P1 in a column direction. The fifth pixel P5 may share a gate line with the first pixel P1 and may be disposed to be adjacent to the first pixel P1 with G and B pixels (i.e., sixth and seventh pixels) therebetween. Positions of R, G, and B pixels are not limited thereto.

During an even frame, luminance distribution rates distributed to pixels P3, P4, and P5 which are alternatively on-driven may be differently set based on a distance to the first pixel P1. The distance to the first pixel P1 may be relatively closer to the third pixel P3 and the fourth pixel P4 and may be relatively farther away from the fifth pixel P5. Therefore, a luminance distribution rate may be relatively larger in the third pixel P3 and the fourth pixel P4 and may be relatively smaller in the fifth pixel P5. For example, when luminance which should be implemented in the second pixel P2 is 100 nit, each of the third pixel P3 and the fourth pixel P4 may implement luminance of 40 nit, and the fifth pixel P5 may implement luminance of 20 nit, on the basis of alternative on driving.

Under an alternative driving condition, temporal/spatial positions and luminance distribution rates of the pixels P3, P4, and P5 which are alternatively on-driven may be changed based on a position of a defective pixel in a display panel. To this end, a pixel map for alternate driving should be previously set, and a defect map for alternate on driving should be previously set. Also, a modulation process performed on image data based on a pixel map and a defect map should be performed. A modulation operation performed on image data for a luminance distribution rate may be performed in a timing controller or a data driver.

Because the pixels P3, P4, and P5 of FIG. 10A which are alternatively on-driven are pixels which should be fundamentally off-driven in an odd frame, only a compensation gray level for luminance distribution may be displayed during the odd frame. Accordingly, a problem where an original image is distorted may not occur based on alternative on driving in the odd frame.

Moreover, because the pixels P3, P4, and P5 of FIG. 10B which are alternatively on-driven are pixels which should be fundamentally off-driven in an even frame, only a compensation gray level for luminance distribution may be displayed during the even frame. Accordingly, a problem where an original image is distorted may not occur based on alternative on driving in the even frame.

FIGS. 11 to 15B are diagrams illustrating a configuration of a timing controller and a data driver according to an embodiment of the present disclosure.

Referring to FIGS. 11 to 15B, a modulation operation on image data based on a luminance distribution rate may be performed by the timing controller TCON.

The timing controller TCON may include an image processor, a memory, a map generating circuit, a pixel selector, a defect selector, and an output circuit.

The image processor may convert image data, on which various image quality compensation processing are completed, into R, G, and B serial formats (for example, R 10 bits, G 10 bits, and B 10 bits) and may generate line count information (CNT) and frame count information (CNT) corresponding to R, G, and B image data.

The memory may store position coordinate information about defective pixels obtained through a luminance measurement process based on a camera. Here, the defective pixels may correspond to pixels having a specific color (for example, red).

The map generating circuit may generate a pixel map illustrated in FIG. 12 on the basis of the line/frame count information (CNT) input from the image processor. The pixel map may be for matching R image data with R pixels for alternate driving. The map generating circuit may generate a defect map illustrated in FIG. 13 with reference to the position coordinate information about the defective pixels stored in the memory. The defect map may represent a position of a defective pixel.

The pixel selector may convert the R, G, and B image data into Ra, Rb, G, and B image data (Ra 10 bits, Rb 10 bits, G 10 bits, and B 10 bits) for alternate driving on the basis of the pixel map.

The defect selector may modulate the Ra, Rb, G, and B image data into Ra', Rb', G, and B image data (Ra' 10 bits, Rb' 10 bits, G 10 bits, and B 10 bits) capable of alternative on driving, on the basis of the defect map.

Figure 14:
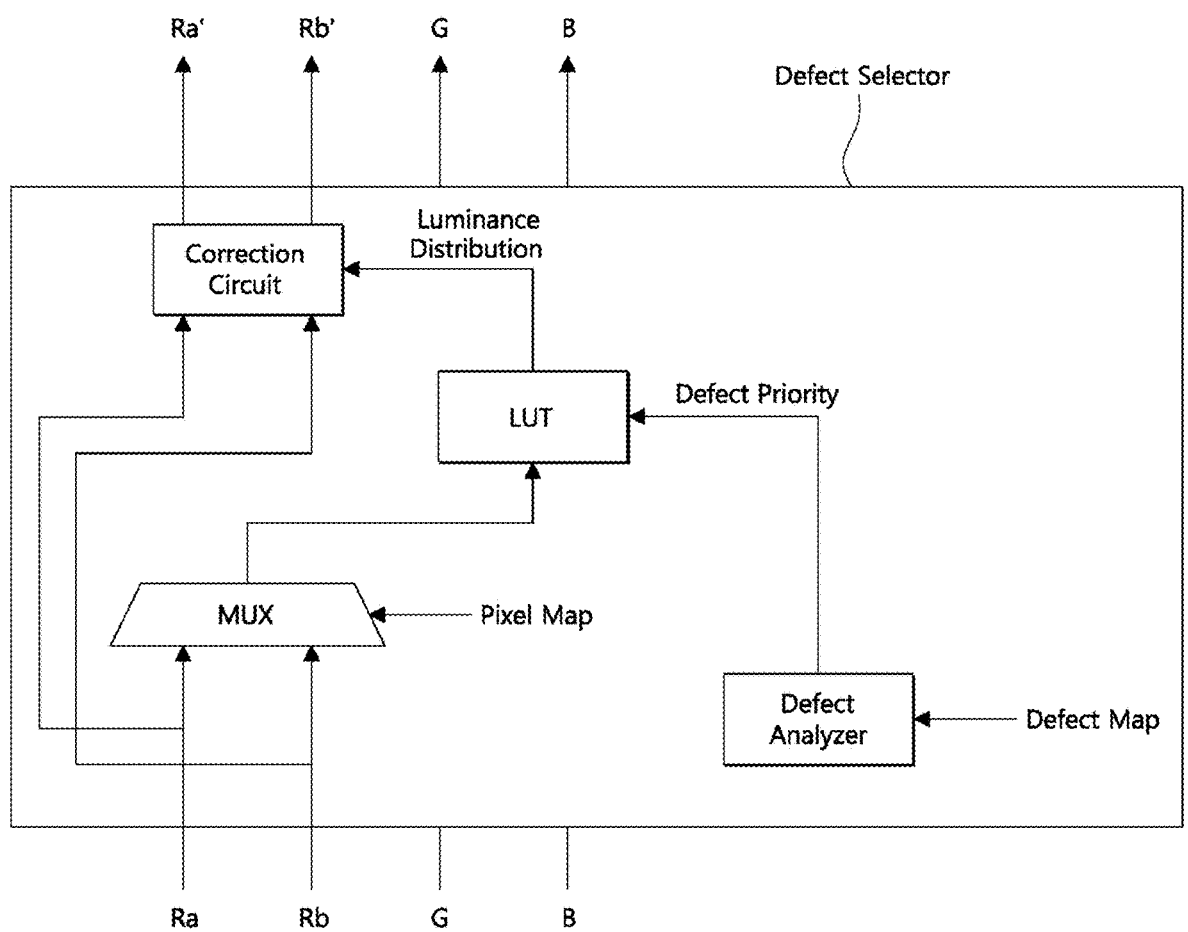
Figure 15A:
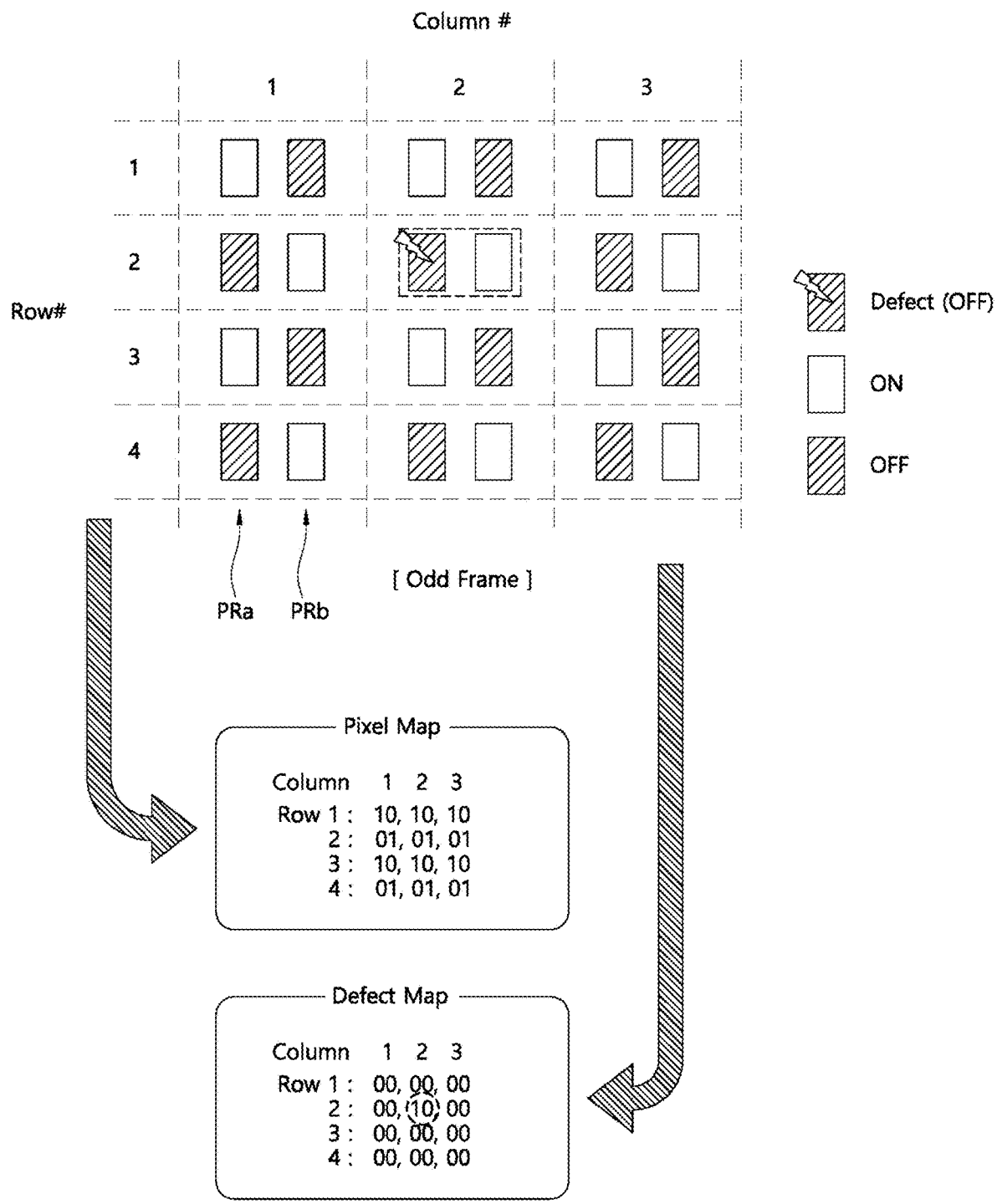
Figure 15B:
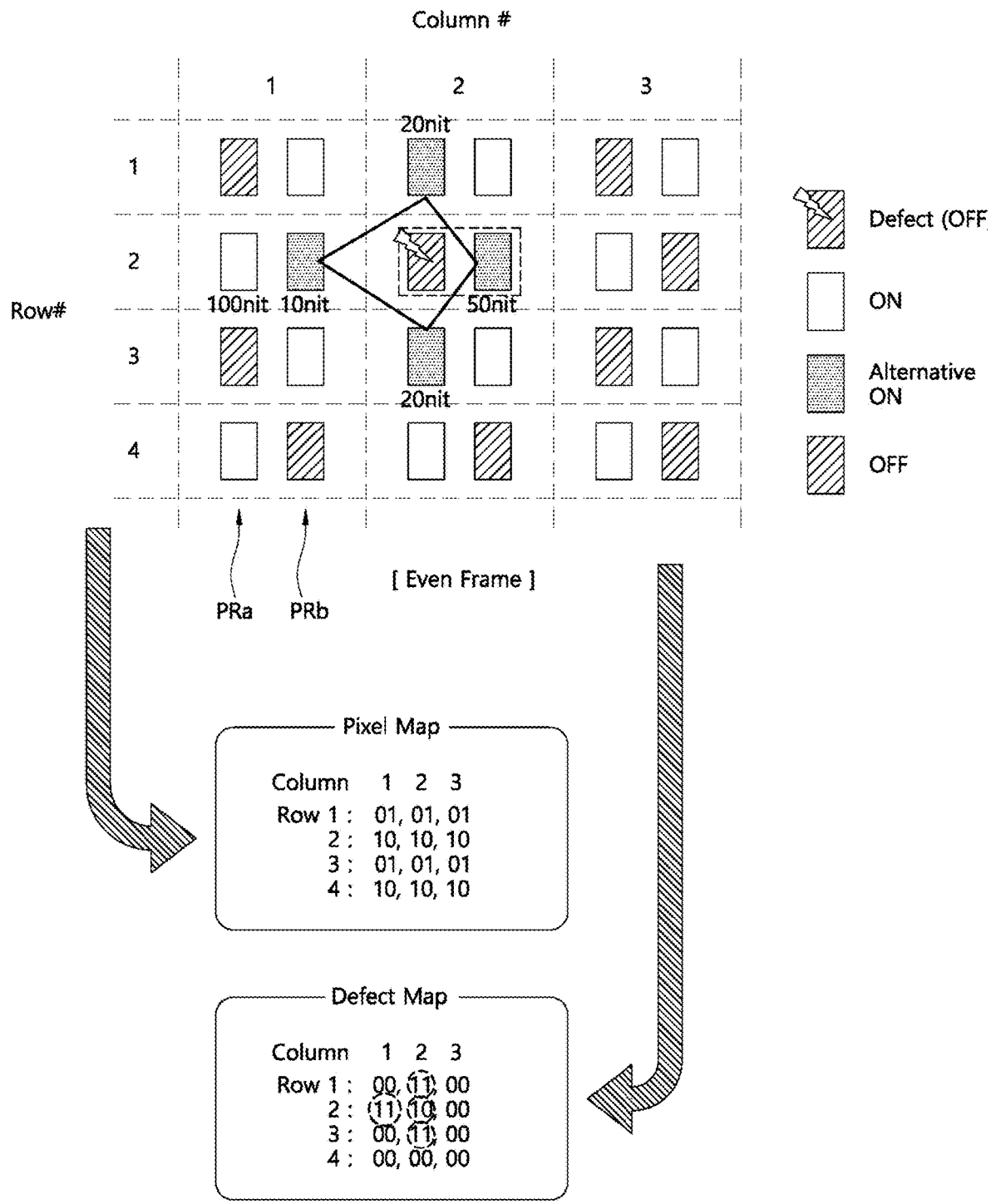

To this end, as in FIG. 14, the defect selector may include a multiplexer MUC, a defect analyzer, a lookup table LUT, and a data modulation circuit. The multiplexer MUX may selectively output Ra and Rb image data on the basis of the pixel map. The defect analyzer may set a defect priority for defining luminance distribution rates of pixels adjacent to a defective pixel on the basis of the defect map. The defect priority may increase as a separation distance to the defective pixel decreases, and on the contrary to this, the defect priority may decrease as a separation distance to the defective pixel increases. Luminance distribution rate information based on the defect priority may be previously stored in the lookup table LUT. The data modulation circuit may modulate the Ra and Rb image data into Ra' and Rb' image data in which a luminance distribution rate of the lookup table is reflected. Furthermore, a pixel map and a defect map based on alternate driving and alternative on driving of FIGS. 9A and 9B are illustrated in FIGS. 15A and 15B.

The output circuit may output Ra', Rb', G, and B image data of 40 bits to a data driver SIC through an internal interface circuit.

Referring back to FIG. 11, a digital-to-analog converter DAC of the data driver SIC may convert the Ra', Rb', G, and B image data into a gamma compensation voltage to generate Ra', Rb', G, and B data voltages. The digital-to-analog converter DAC may supply the Ra', Rb', G, and B data voltages to main pixels PRa, redundancy pixels PRb, G pixels PG, and B pixels PB through data lines DL.

Figure 16:
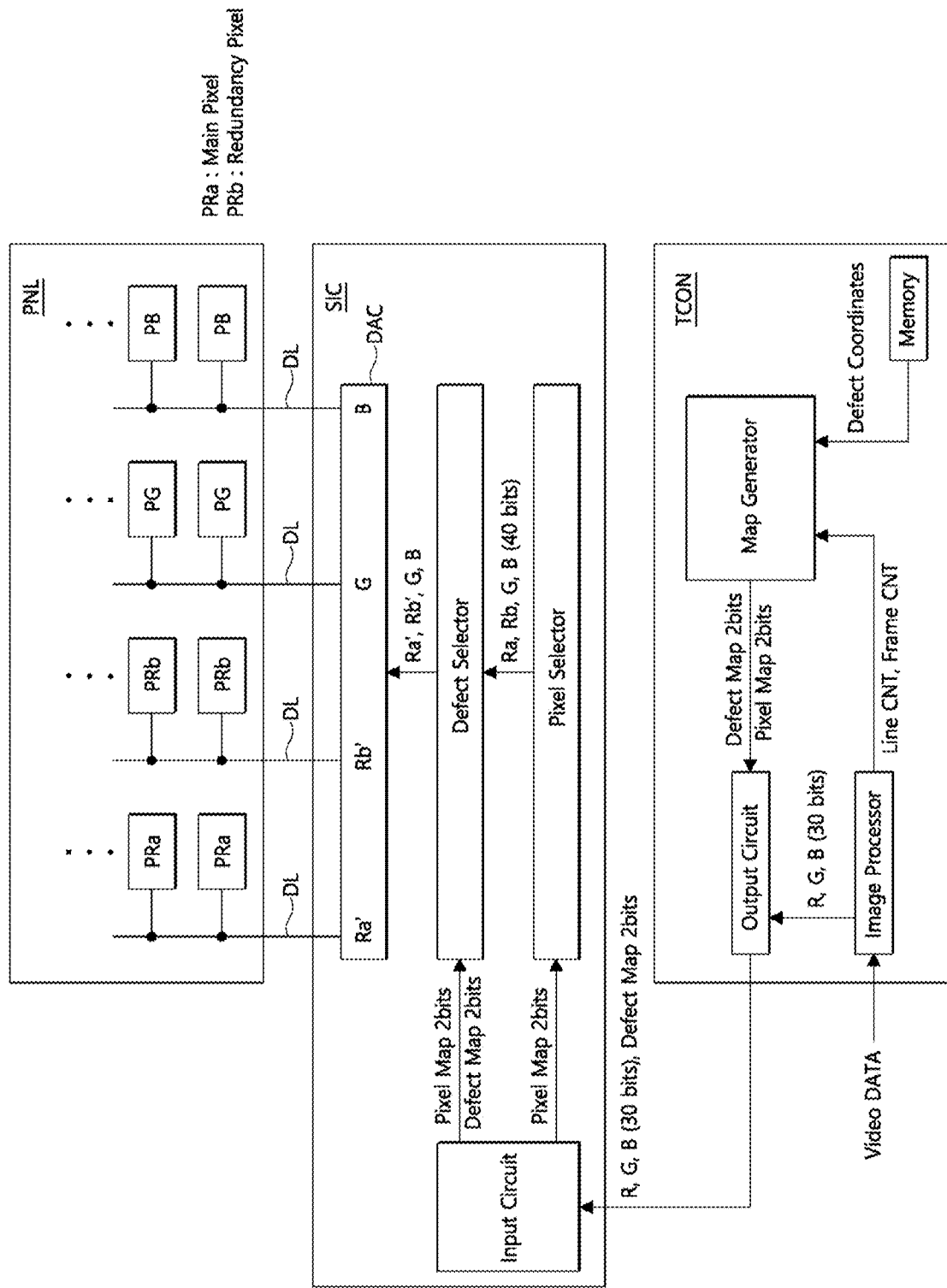
FIGS. 16 and 17 are diagrams illustrating a configuration of a timing controller and a data driver according to another embodiment of the present disclosure.
Figure 17:
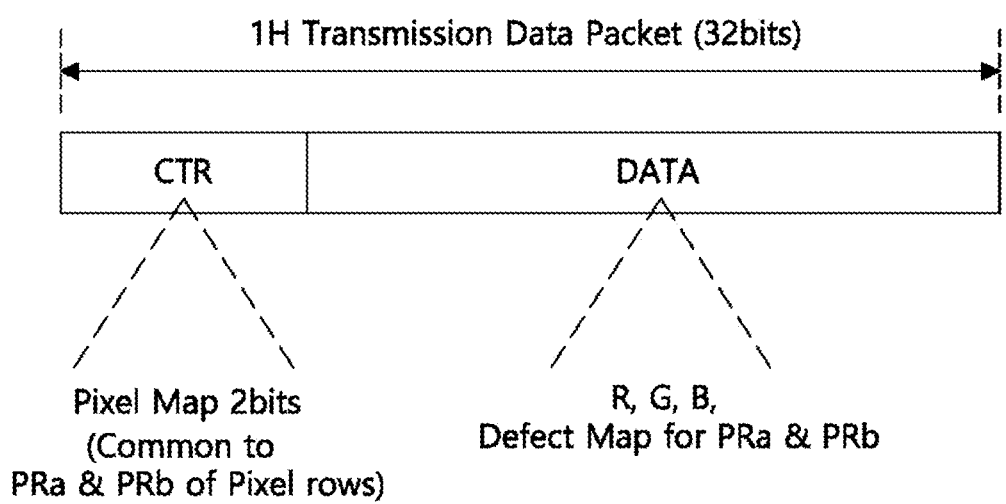

FIGS. 16 and 17 are diagrams illustrating a configuration of a timing controller and a data driver according to another embodiment of the present disclosure. In FIG. 16, the amount of data transferred between a timing controller TCON and a data driver SIC may be reduced compared to FIG. 11.

Referring to FIGS. 16 and 17, a modulation operation on image data based on a luminance distribution rate may be performed by the data driver SIC.

The timing controller TCON may include an image processor, a memory, a map generating circuit, and an output circuit.

The image processor may convert image data, on which various image quality compensation processing are completed, into R, G, and B serial formats (for example, R 10 bits, G 10 bits, and B 10 bits) and may generate line count information (CNT) and frame count information (CNT) corresponding to R, G, and B image data.

The memory may store position coordinate information about defective pixels obtained through a luminance measurement process based on a camera. Here, the defective pixels may correspond to pixels having a specific color (for example, red).

The map generating circuit may generate a pixel map illustrated in FIG. 12 on the basis of the line/frame count information (CNT) input from the image processor. The pixel map may be for matching R image data with R pixels for alternate driving. The map generating circuit may generate a defect map (2 bits) illustrated in FIG. 13 with reference to the position coordinate information about the defective pixels stored in the memory. The defect map may represent a position of a defective pixel.

The output circuit may output R, G, and B image data of 30 bits and a 2-bit defect map to the data driver SIC through an internal interface circuit. As in FIG. 17, 32-bit information including a defect map and the R, G, and B image data may be included in a data region of a transmission data packet output to the data driver SIC through the internal interface circuit. In this case, a 2-bit pixel map may correspond to the main and redundancy pixels PRa and PRb in common, and thus, may be added to a control region of the transmission data packet and transmitted.

The data driver SIC may include a pixel selector, a defect selector, and a digital-to-analog converter DAC.

Operations of the pixel selector, the defect selector, and the digital-to-analog converter DAC may be substantially the same as operations described above with reference to FIG. 11.

The present embodiment may realize the following effects.

According to the present embodiment, in order to decrease a reduction in a yield rate caused by a transfer error in micro LED chips, two LED chips may be connected for each of R, G, and B pixels. In a G chip and a B chip, because emission efficiency is good in low current density, two LED chips may be driven in parallel for each of a G pixel and a B pixel. On the other hand, in an R chip, because emission efficiency is not good in low current density, one R chip may be independently driven (or separately driven) in each main R pixel and redundancy R pixel for a high current density.

A main R pixel and a redundancy R pixel may be alternately driven for a high current density, and when one or more of a main R pixel and a redundancy R pixel included in one unit pixel at a specific position are defective pixels, one or more of a main R pixel and a redundancy R pixel included in other unit pixels adjacent thereto may be alternatively on-driven, thereby compensating for luminance loss at a specific position caused by the turn-off of a defective pixel.

The effects according to the present disclosure are not limited to the above examples, and other various effects may be included in the specification.

While the present disclosure has been particularly shown and described with reference to example embodiments thereof, it will be understood by those of ordinary skill in the art that various changes in form and details may be made therein without departing from the spirit and scope of the present disclosure as defined by the following claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A micro light emitting diode display apparatus comprising:
    a first pixel including a micro light emitting diode of a first color electrically connected to a first data line and independently driven;
    a second pixel including a micro light emitting diode of the first color electrically connected to a second data line adjacent to the first data line and independently driven, a third pixel and a fourth pixel electrically connected to the first data line, disposed with the first pixel in between, and each having a micro light emitting diode of the first color independently driven, and
a fifth pixel sharing a gate line with the first pixel and having a micro light emitting diode of the first color independently driven,
wherein the first pixel and the second pixel are included in a first unit pixel,
wherein the first pixel and the second pixel are alternately on-driven in a first period and a succeeding second period,
wherein the second to fifth pixels are adjacent to the first pixel in different directions, and
wherein the first pixel is off-driven and the second to fifth pixels are alternatively on-driven.

2. The micro light emitting diode display apparatus of claim 1, wherein, when all of the first pixel and the second pixel are normal pixels,
for the first period, the first pixel is off-driven and the second to fifth pixels are on-driven, and
for the second period, the first pixel is on-driven and the second to fifth pixels are off-driven.

3. The micro light emitting diode display apparatus of claim 1, wherein, when the first pixel is a defective pixel and the second pixel is a normal pixel,
for the first period, the first pixel is off-driven and the second pixel is on-driven, and
for the second period, the first pixel is off-driven and the second to fifth pixels are alternatively on-driven.

4. The micro light emitting diode display apparatus of claim 3, wherein luminance to be implemented in the first pixel for the second period is distributed to each of the second to fifth pixels, which are alternatively on-driven for the second period.

5. The micro light emitting diode display apparatus of claim 4, wherein each of luminance distribution rates distributed to the second to fifth pixels alternatively on-driven for the second period is changed based on a distance to the first pixel.

6. The micro light emitting diode display apparatus of claim 5, wherein the luminance distribution rate is largest in the second pixel, is second largest in the third pixel and the fourth pixel, and is smallest in the fifth pixel.

7. The micro light emitting diode display apparatus of claim 1, wherein
the third pixel is included in a second unit pixel adjacent to the first unit pixel in a first direction, and
the fourth pixel is included in a third unit pixel adjacent to the first unit pixel in a second direction.

8. The micro light emitting diode display apparatus of claim 1, wherein
the fifth pixel is included in a fourth unit pixel adjacent to the first unit pixel in a third direction.

9. The micro light emitting diode display apparatus of claim 1, wherein, when the first pixel and the second pixel are defective pixels,
for the first period, the first pixel and the second pixel are off-driven and a sixth pixel and a seventh pixel electrically connected to the second data line to be adjacent to the second pixel are alternatively on-driven,
each of the sixth pixel and the seventh pixel comprises a micro light emitting diode of the first color independently driven, the sixth pixel is included in a second unit pixel adjacent to the first unit pixel in a first direction, and
the seventh pixel is included in a third unit pixel adjacent to the first unit pixel in a second direction.

10. The micro light emitting diode display apparatus of claim 9, wherein an eighth pixel adjacent to the second pixel shares a gate line with the first pixel and the second pixel and is alternatively on-driven for the first period,
the eighth pixel comprises a micro light emitting diode of the first color independently driven, and
the eighth pixel is included in a fourth unit pixel adjacent to the first unit pixel in a third direction.

11. The micro light emitting diode display apparatus of claim 10, wherein luminance to be implemented in the second pixel for the first period is distributed to each of the sixth to eighth pixels which are alternatively on-driven for the first period.

12. The micro light emitting diode display apparatus of claim 11, wherein each of luminance distribution rates distributed to the sixth to eighth pixels alternatively on-driven for the first period is changed based on a distance to the second pixel.

13. The micro light emitting diode display apparatus of claim 12, wherein the luminance distribution rate is larger in the sixth pixel and the seventh pixel than in the eighth pixel.

14. The micro light emitting diode display apparatus of claim 1, wherein, when the first pixel and the second pixel are defective pixels,
for the second period, the first pixel and the second pixel are off-driven and the third to fifth pixels and are alternatively on-driven.

15. The micro light emitting diode display apparatus of claim 14, wherein luminance to be implemented in the first pixel for the second period is distributed to each of the third to fifth pixels, which are alternatively on-driven for the second period.

16. The micro light emitting diode display apparatus of claim 15, wherein each of luminance distribution rates distributed to the third to fifth pixels alternatively on-driven for the second period is changed based on a distance to the first pixel.

17. The micro light emitting diode display apparatus of claim 16, wherein the luminance distribution rate is larger in the third pixel and the fourth pixel than in the fifth pixel.

18. The micro light emitting diode display apparatus of claim 1, further comprising:
a ninth pixel including a first micro light emitting diode of a second color and a second micro light emitting diode of the second color electrically connected to a third data line adjacent to the second data line and driven in parallel; and
a tenth pixel including a first micro light emitting diode of a third color and a second micro light emitting diode of the third color electrically connected to a fourth data line adjacent to the third data line and driven in parallel,
wherein the ninth pixel and the tenth pixel are included in the first unit pixel.

19. The display apparatus of claim 1, wherein each of the first pixel, the second pixel, the third pixel, the fourth pixel and the fifth pixel include either a micro light emitting diode or a mini light emitting diode.

* * * * *